(12) United States Patent
Yang et al.

(10) Patent No.: US 6,316,953 B1
(45) Date of Patent: Nov. 13, 2001

(54) CONTACT TYPE PROBER AUTOMATIC ALIGNMENT

(75) Inventors: Steven Jyh-Ren Yang; Jane Huei-Chen Chan; Chung-Tao Chang; Hsiu-Tsang Lee, all of Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/364,600

(22) Filed: Jul. 30, 1999

Related U.S. Application Data

(62) Division of application No. 08/958,116, filed on Oct. 27, 1997, now Pat. No. 6,049,216.

(51) Int. Cl.[7] .................................................. G01R 31/28
(52) U.S. Cl. ........................................... 324/758; 324/765
(58) Field of Search ................................ 324/758, 158.1, 324/754, 765; 356/399, 400, 401; 348/86, 87

(56) References Cited

U.S. PATENT DOCUMENTS

| | | | | |
|---|---|---|---|---|
| 4,929,893 | * | 5/1990 | Sato et al. ............................ | 356/401 |
| 4,943,767 | * | 7/1990 | Yokota .................................... | 348/87 |
| 5,091,692 | * | 2/1992 | Ohno et al. ........................... | 324/758 |
| 5,422,579 | * | 6/1995 | Yamaguchi ........................... | 324/754 |

* cited by examiner

Primary Examiner—Ernest Karlsen

(57) ABSTRACT

Automatic alignment methods for a membrane prober are disclosed. Alignment patterns are designed and manufactured on both a membrane prober and a wafer under test. The patterns are properly designed for acquiring a first set of measurement data that provide relative position information when the prober contacts the wafer. A second set of measurement data can be obtained by a controlled move between the prober and the wafer. The relative position including the translation offset and the rotation angle can be computed by the information derived from the two sets of measurement data. The second set of measurement data may also be acquired by having two alignment pattern pairs that are made to contact in a single touch. More accurate alignment can be achieved by using more pairs of alignment patterns.

7 Claims, 11 Drawing Sheets

CONTACT TYPE PROBER AUTOMATIC ALIGNMENT

This is a division of Ser. No. 08/958,116, filed Oct. 27, 1997, now U.S. Pat. No. 6,049,216.

FIELD OF THE INVENTION

The present invention relates to probe cards for an automatic wafer probing system, and more specifically to the alignment of a membrane prober for a wafer probing system.

BACKGROUND OF THE INVENTION

Wafer probing test has been an important step for ensuring that the semiconductor devices manufactured on a wafer are not defective before they are packaged. A conventional automatic wafer probing system (AWPS) as shown in FIG. 1 consists of a platen 1, a forcer 2 on which a wafer chuck 3 is mounted, a ring carrier 4 on which a microscope 5 is mounted, a CCD camera 6 for pattern recognition, a wafer Z-profile sensing assembly 7, and a material handling assembly, which is not shown in the figure, for loading and unloading a wafer for testing. In general, an X-Y coordinate system is assumed on the platen 1 and the forcer 2 can do positional translation on it, either in X, Y, or simultaneously X and Y directions. The wafer chuck 3 can move in Z (height) direction as well as perform a θ rotation. In addition to holding a probe card in place, the ring carrier 4 has a few precision alignment posts for level-adjusting the probe card by the operator during an initial setup time. Because the AWPS has an automatic alignment module working associated with the CCD camera for doing pattern recognition, the coordinate of the wafer under test can easily be figured out.

FIG. 2 shows a conventional Epoxy needle probe card that is usually used to test one single die during each test. Since the needle type test pins are long, they induce parasitic induction and capacitance effects. Therefore, impedance match becomes difficult to accomplish and causes the degradation of the test speed. In addition, the X-Y shift at the contact test point as well as the difficulty in meeting the area-array pins are some drawbacks of such a probe card. Although needle type probe cards have been built for testing multiple dies, these cards having a large number of pins are expensive to build, maintain and repair. Besides, it is very time consuming to repair damages of such cards and the repairing can only be done by a skilled operator.

As integrated circuits become faster and more complex, the number of input/output (I/O) pads increases drastically. In order to accommodate the increasing number of I/O pads, the size and spacing of pads must decrease. I/O pads in an area-array format have been proposed for integrated circuits having large number of inputs and outputs. For circuit chips designed to be used in multi-chip modules (MCM), the area-array format becomes more common and may replace the traditional periphery format. The probing test of such chips using conventional needle probe cards, however, is very difficult because of the area-array format and the reduction in pad size and spacing.

The traditional approach of using a conventional probe card to interface a chip introduces parasitic capacitance and inductance that make it impossible to test the chip at full speed. Therefore, chips that are functional but do not meet speed requirements are usually packaged and then scraped later. This has become a severe problem as the operational speed of circuit devices continues to increase. Scraping and reworking finished systems that do not meet speed requirements greatly increases manufacturing cost. Therefore, it has become essential to test circuit devices such as MCMs at full speed. Furthermore, the output drivers of an advanced circuit device are designed with a smaller size in anticipation of reduced parasitic effects between chips. Hence, they are less effective in driving the conventional probe card and the tester. An accurate sort of good chips at the wafer level can save significant packaging costs. In order to provide a better screening process at the wafer level, it is necessary to use probe cards that have higher resolutions and allow testing at higher speeds. The probe cards also have to place less loading to the output drivers of the device under test.

An electronic membrane prober is a membrane style probe card fabricated from a silicon wafer with typical integrated circuit and micro-machining technologies. The membrane prober (MP) is capable of providing a very large number of probe tips in any format, including area-array prober pad format, and is designed to satisfy the requirements of high speed and high resolution wafer-level testing. The membrane is a thin, free-handling and low stress layer of silicon, silicon dioxide, silicon carbide, silicon nitride or polyimide. FIG. 3 shows a conceptual design of the membrane prober. The probe lines are aluminum and the probe tips are tungsten. The probe card is fabricated with conventional integrated circuit processing techniques that are well established. In addition, more functionality can be added to the prober because active test circuitry can also be placed on the membrane prober.

The membrane film of a membrane prober provides the mechanical support for the probe lines and tips as well as the alignment of the probe card to the wafer under test if the membrane film is transparent. Although there are many advantages over a conventional epoxy needle probe card, it is necessary that the membrane prober has the transparency characteristic on its membrane film. When the density of the test tips and the area of the membrane become higher and larger, the transparency requirement will be difficult to meet. It may be possible to design a sophisticated optical system between the membrane prober and the wafer under test so that they can be aligned. However, the cost and maintenance are expensive. In addition, the space constraint on a wafer probing test system may make the manipulation of such a complex optical alignment system unappreciative.

SUMMARY OF THE INVENTION

The present invention has been made to overcome the above mentioned drawbacks of a membrane prober. The primary object of this invention is to provide almost automatic alignment methods for a wafer probing test system. Another object of this invention is to provide alignment patterns that can be used in the alignment methods of this invention. It is also an object of this invention to provide measurement circuits for acquiring data in the alignment methods.

According to the present invention, alignment patterns are designed and manufactured on both a membrane prober and the wafer under test. The alignment pattern on the membrane prober comprises a plurality of test tips forming a virtual circle and another test tip at the center of the virtual circle. A solid metal pad is formed on the wafer under test as the alignment pattern. Two necessary conditions are first met in the pre-alignment process for setting up the prober onto a ring carrier to position it properly for the alignment method. By making the prober contact the wafer, conduction paths are formed by the alignment patterns. A measurement circuit is then used to acquire a first set of data for providing information on the relative position of the membrane prober to the wafer.

A second set of data are required for providing further information for aligning the membrane to the wafer. Two approaches are presented in the invention for acquiring the data. The second set of data can be obtained by moving the membrane prober with an offset distance and acquiring the data from the conduction paths formed while the prober and the wafer have a second contact. The can also be obtained by having two pair of alignment patterns. Based on the two sets of data, this invention presents alignment algorithms for determining the translation offset as well as the rotation angle between the membrane prober and the wafer under test.

Both first and second sets of data are acquired by a circuit that measures the conduction paths formed by the test tips of the membrane prober and the wafer. How the test tips located on the virtual circle can form conduction paths with respect to the test tip at the center through the solid metal pad depends on the relative position of the prober to the wafer. The information about the conduction paths formed after the contact touch provides data for computing the offset and the rotation angle.

By using a more sophisticated measurement circuit, conduction paths between test tips located on the virtual circle and the solid metal pad can also be used to determine the relative position without having a test tip at the center. The removal of the central test tips results in more margin for positioning the membrane prober in the pre-alignment. In other words, the sizes of the alignment patterns on the membrane prober and the wafer under test can be reduced by a half. More pairs of alignment patterns may also be used to improve the accuracy of the alignment.

DETAILED DESCRIPTION OF THE PREFERRED EMBODIMENTS

Figure 4:
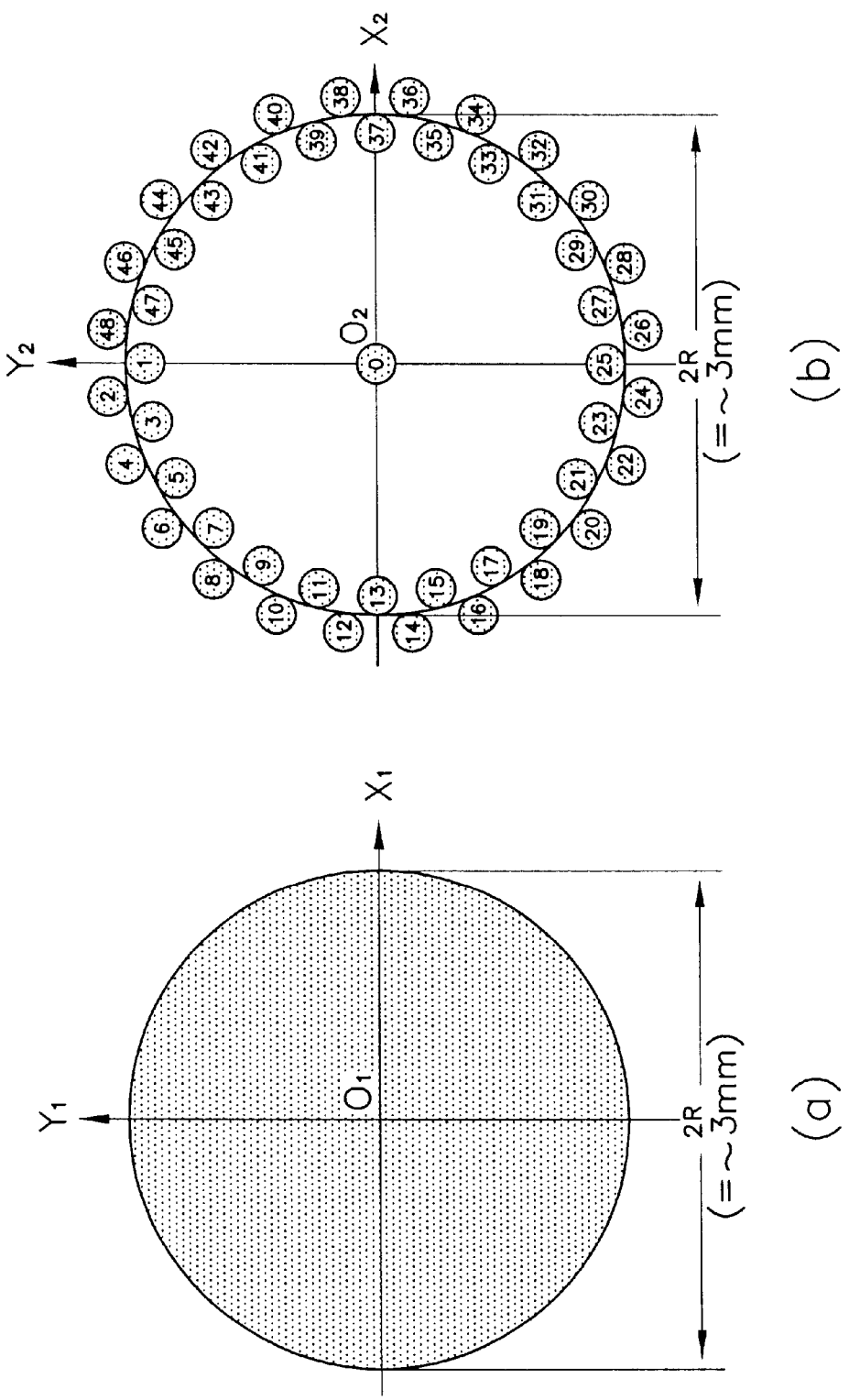
FIG. 4 shows the alignment patterns on (a) the wafer under test and (b) the membrane prober of this invention.

With reference to FIG. 4, a pair of alignment patterns (APs) used in this invention are illustrated. The alignment algorithms for the probe card disclosed in this invention require at least one such pair of APs. One alignment pattern comprising a solid conductive metal pad as shown in FIG. 4(a) is manufactured on the wafer under test (WUT). The other alignment pattern comprising a plurality of test tips as shown in FIG. 4(b) is fabricated on the membrane prober (MP) film. For convenience, the former is referred as APW and the latter is referred as APM in the following disclosure. The diameter of the solid metal pad of the APW can be as small as 3 mm. A coordinate system $(X_1, Y_1)$ centered at $O_1$ as shown in FIG. 4(a) is defined on the APW. The test tips on the membrane prober film are located around a virtual circle as shown in FIG. 4(b). In the center of the APM, there is a test-tip-0. The diameter of the virtual circle is the same as the diameter of the solid metal pad of the APW. If a 50 um pitch of the test tips and a 3 mm diameter of the APW are assumed, there are about 188 test tips distributed around the virtual circle. A coordinate system $(X_2, Y_2)$ centered at $O_2$ as shown in FIG. 4(b) is defined on the APM.

Figure 1:
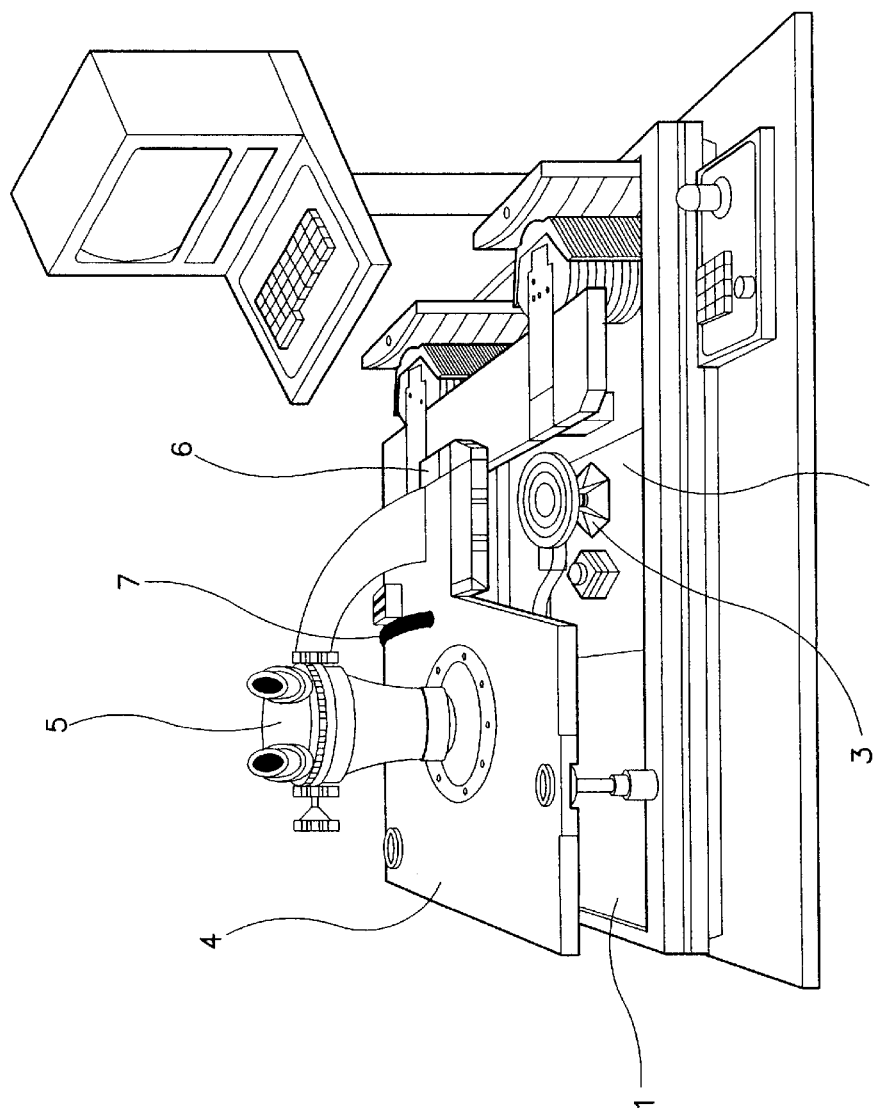
FIG. 1 shows (a) the top view and (b) the cross-sectional view of a conventional automatic wafer probing system.
Figure 2:
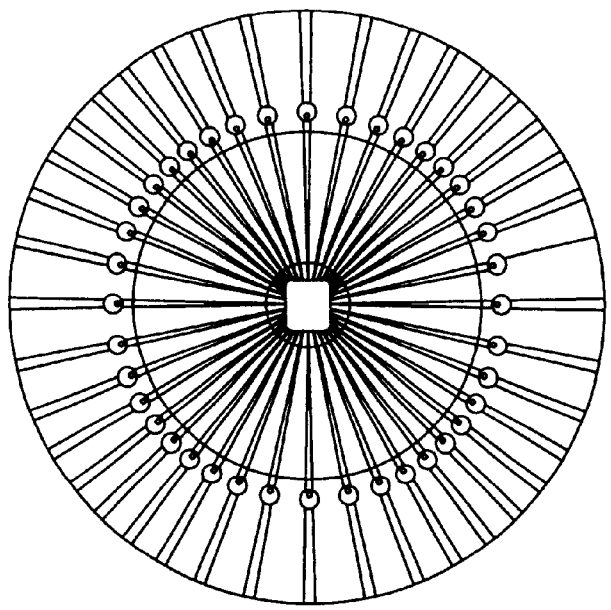
FIG. 2 shows a conventional Epoxy needle prober card.
Figure 2:
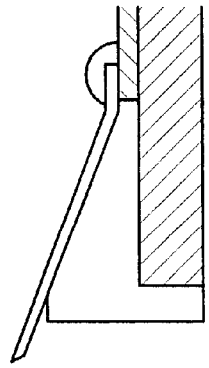
Figure 2:
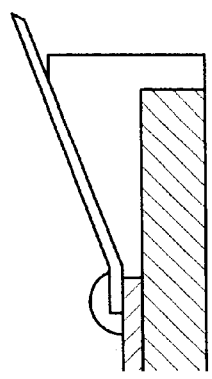
Figure 3:
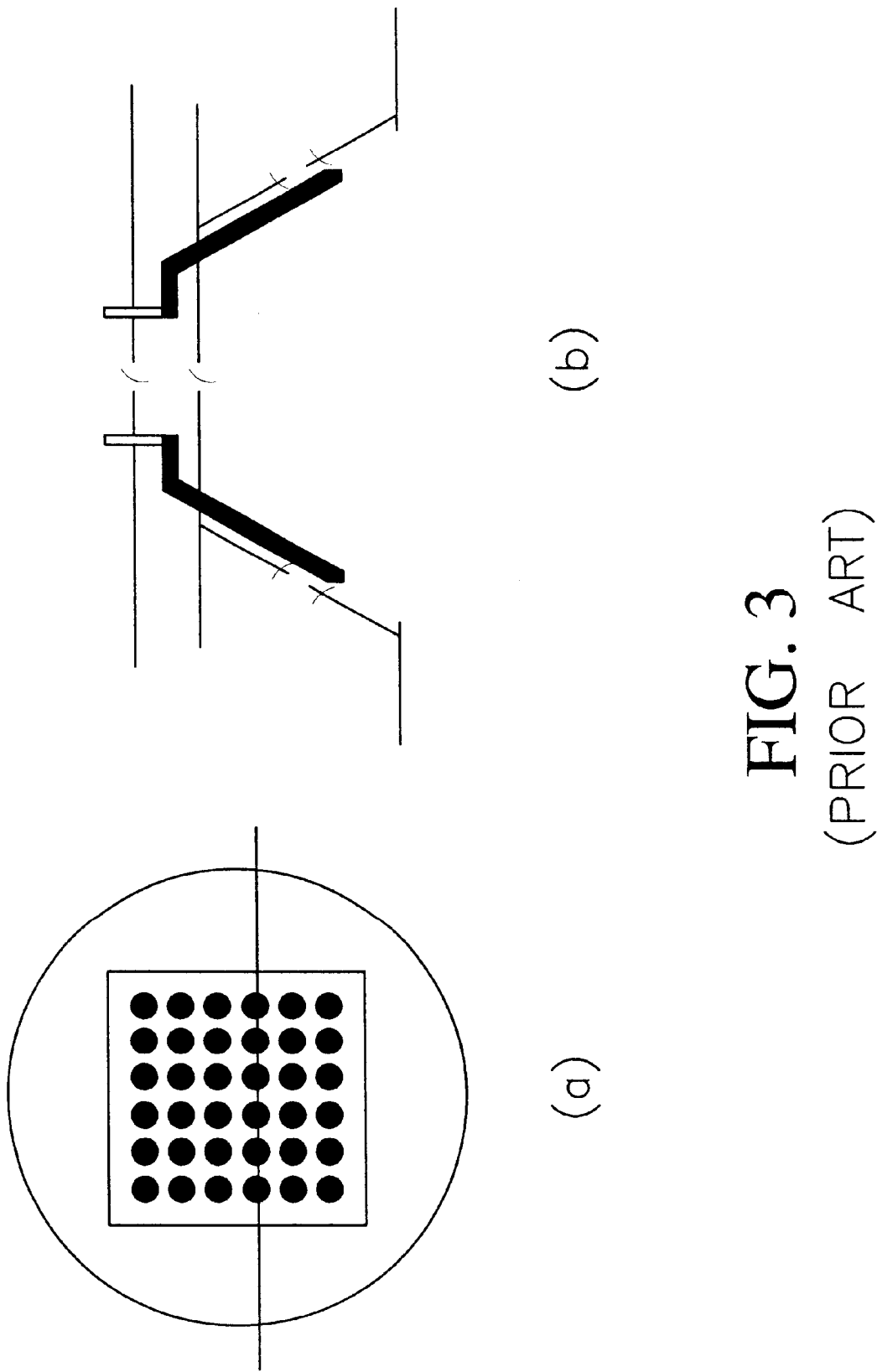
FIG. 3 shows (a) the top view and (b) the cross-sectional view of a conceptual design of a membrane probe card having an array pad format.

The objective of this invention is to remove the transparency requirement of the MP and make the alignment between the MP and the WVUT easier. To ensure the success of the alignment of this invention, two conditions have to be satisfied when the prober is set up. The first condition is that the X-Y position pre-alignment accuracy for inserting and fixing the MP on the ring carrier 4 of FIG. 1 should be within roughly the size of the solid metal pad. This position tolerance should include the position accuracy of the ring carrier 4 relative to the platen 1. In other words, the position accuracy of the MP relative to the platen 1 should be maintained around the size of the solid metal pad. The second condition is that the rotation accuracy for inserting and fixing the MP on the carrier 4 should be within +/−40°.

Figure 5:
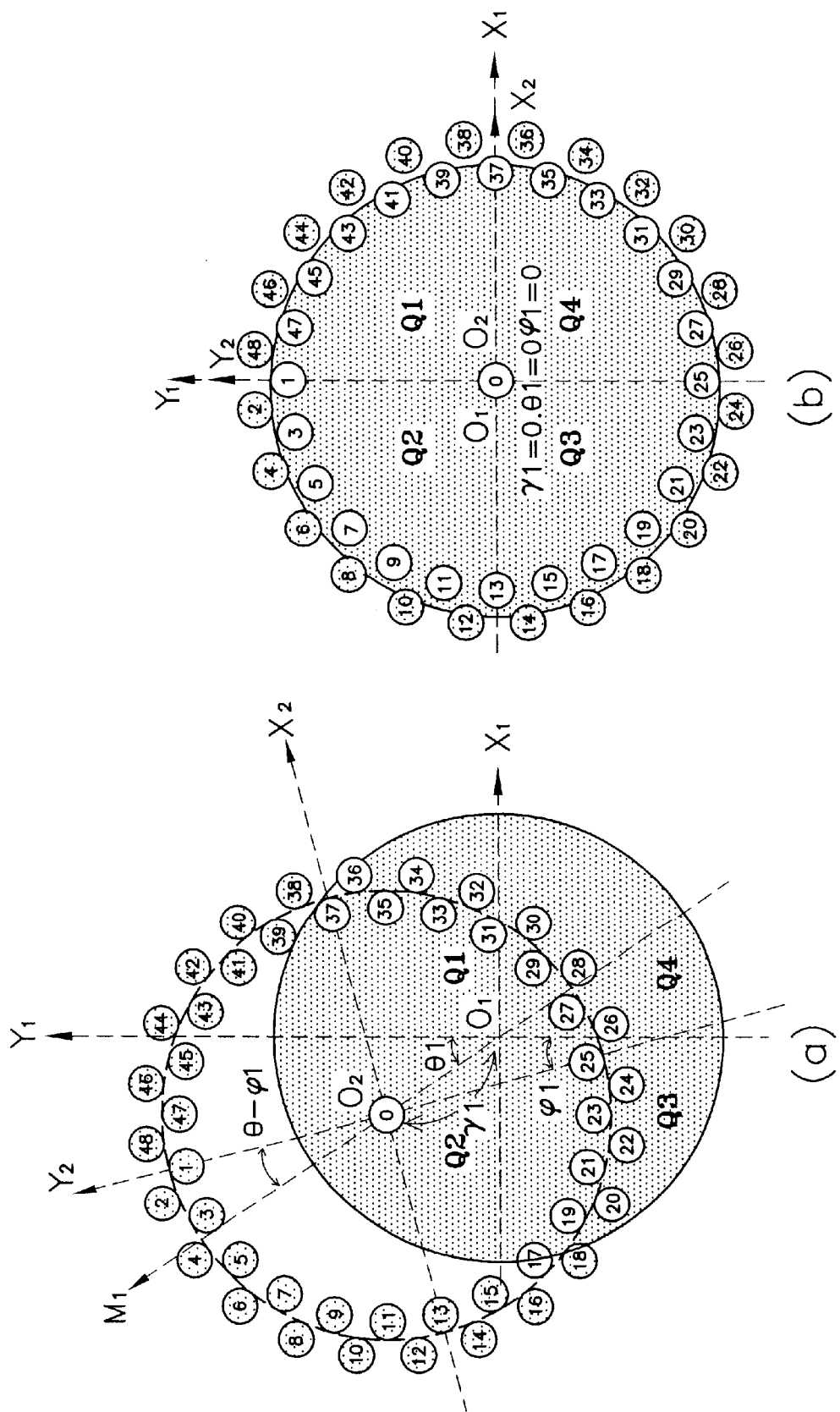
FIG. 5 illustrates (a) a typical case where the test-tip-0 of the prober falls inside the solid metal pad of the wafer alignment pattern in this invention and (b) a case where the prober is perfectly aligned with the wafer.

For the probing test, a pre-alignment is first made to roughly align the two alignment patterns in contact. With the first condition described above, the test-tip-0 must fall inside of the APW. In addition, the intersection angle between the $Y_1$ axis of the APW and the $Y_2$ axis of the APM is within +/−40°, i.e. $-40° < \phi_1 < 40°$ as shown in FIG. 5(a) due to the second condition. FIG. 5(a) shows a case where the pre-alignment has positioned the test-tip-0 of the APM in the second quadrant of the APW. For comparison, FIG. 5(b) illustrates a case where the pre-alignment has resulted in a perfect alignment between the APW and the APM.

Figure 6:
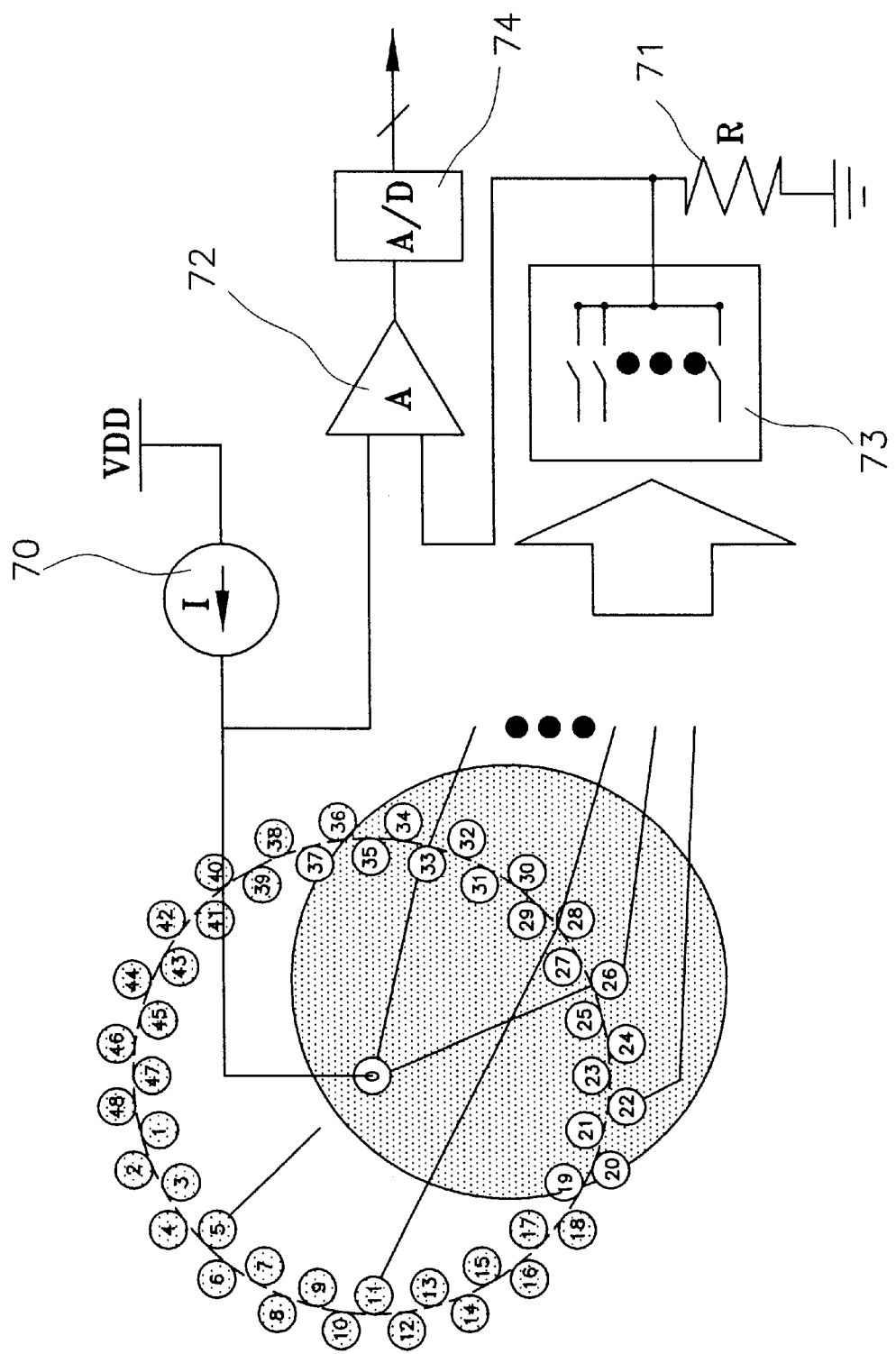
FIG. 6 shows a circuit architecture of this invention for measuring the conductance of the current loop established between the test-tip-0 and one of the other test tips.

As can be seen from FIG. 5(a), when the alignment patterns APW and APM are in contact and the test-tip-0 is kept inside of the APW, each test tip inside the APW forms an individual conduction path between itself and the test-tip-0. For test tips outside of the APW, no conduction path can be formed. Therefore, one can determine which test tips are inside the APW by driving a current source to the test-tip-0 and sequentially probing test tips around the virtual circle. FIG. 6 illustrates a circuit architecture for measuring the conductance between each test tip and the test-tip-0. The circuit comprises a current source 10 that is connected to the test-tip-0 and a first input terminal of an amplifier 11. A multiplexer 12 has a plurality of inputs each being connected to a test tip of the APM by a conducting trace on the MP, and a single output connected to a resistor 13 as well as a second input terminal of the amplifier 11. The output of the amplifier 11 is sent to an analog-to-digital (A/D) converter 14.

More accurate measurement can be accomplished by adding some complexity to the test circuit. For example, the current source or the gain of the amplifier can be made adjustable. The circuit architecture is fairly complex due to the large number of test tips which result in a large number of input channels to the multiplexer. An active prober that integrates all the test circuits on the same substrate as the MP, or employs bare dies attached to the membrane substrate by using MCM (Multi-Chip Module) process becomes desirable.

Based on the test circuit of FIG. 6, the information regarding all the distribution of the test tips inside or outside the APW can be obtained. For example, as shown in FIG. 5(a), the test tips 38, 39 and 15, 16 are both end points on the virtual arc section formed by test tips outside of the APW. From these end points, the mid-position indicated by the vector axis $M_1$ at 3,4 can be determined. It can also be proved that $M_1$ always passes through $O_1$ and $O_2$. Furthermore, by using the design data such as the pitch of the test tip and the radius of the APW or the APM, the relative distance $\gamma_1$ of the origin $O_2$ to origin $O_1$ can be calculated.

The final objective of the pre-alignment is to estimate three parameters, $\gamma_1$, $\theta_1$ and $\phi_1$, where ($\gamma_1$, $\theta_1$) is the polar coordinate of the origin $O_2$ in ($X_1$, $Y_1$, $O_1$) coordinate system and $\gamma_1$ is the angle between the $Y_2$ axis and the $Y_1$ axis as shown in FIG. 5(a). In the following discussion, ($X_1$, $Y_1$, $O_1$) is referred to as a fixed coordinate system and an angle in the counterclockwise direction is considered a positive angle. It can be understood that although the angle $\theta_1-\phi_1$, denoted as $\kappa_1$, between $M_1$ and the $Y_2$ axis may be determined from the distribution information of the test tips, more information is necessary for computing the exact angle $\theta_1$ because many different positions of $O_2$ can result in identical $\gamma_1$ and $\theta_1-\phi_1$. There are wo approaches two determining the angles $\theta_1$ and $\phi_1$. The first approach moves the APM or the APW by a known displacement and takes a second measurement with a similar technique described above while the alignment patterns are having a second touch. The second approach relies on two separate pairs of alignment patterns.

The first approach to estimating the angles $\theta_1$ and $\phi_1$ requires a second set of data taken while the APM and the APW have a different relative position. For simplifying the following explanation, the coordinate system ($X_1$, $Y_1$, $O_1$) of the APW is assumed fixed and the APM is moved relative to the APW. In practice, the relative movement comes from a chuck forcer on which the wafer under test is held and fixed. In addition, although it is assumed that $O_2$ is located in an upper quadrant $Q_1$ or $Q_2$ of ($X_1$, $Y_1$, $O_1$), the following description remains valid if $O_2$ is located in a lower quadrant $Q_3$ or $Q_4$.

It should be noted that the angle $\phi_1$ is kept fixed while the relative movement is made in the first approach. The displacement should be such that $O_2$ can be maintained in the same quadrant. The movement of the APM relative to the APW is determined to be parallel to $X_1$ or $Y_1$ axis in either the positive or negative direction. The movement direction depends on the distance of $O_2$ to both axes, and the value of $\gamma_1$. In principle, $O_2$ is moved away from $O_1$ if the value $\gamma_1$ is less than R/2 and $O_2$ is moved toward $O_1$ if the value $\gamma_1$ is greater than R/2, where R is the radius of the APW. The displacement distance is about R/4.

If $(\theta_1-\phi_1)<60°$, $O_2$ is considered nearer to the $Y_1$-axis and the movement should be parallel to $Y_1$-axis. The direction of the movement is chosen in the positive $Y_1$-axis direction if $\gamma_1$ is less than R/2 and in the negative $Y_1$-axis direction otherwise. If $(\theta_1-\phi_1)>60°$, the movement should be parallel to $X_1$-axis. Under this circumstance, it is necessary to determine whether $O_2$ is located in quardant $Q_1$ or $Q_2$ by the location of M1 vector axis. Then, the movement direction along $X_1$-axis can be determined in the same way as described above. In some cases, it may happen that the test-pin-0 falls outside of APW or $O_2$ moves into other quadrant after the movement. Consequently, the second touch fails to provide useful measurement for determining the angle $\theta_1$ and $\phi_1$. When these undesirable cases occur, it becomes necessary to conduct additional movement until a successful second touch that provides good measurement is achieved.

Figure 7:
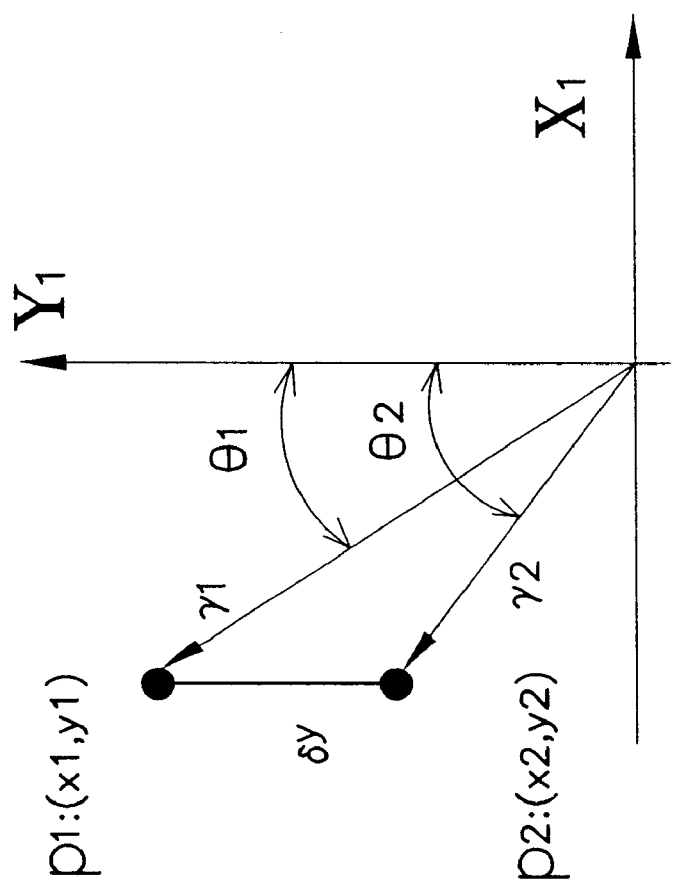
FIG. 7 illustrates the two positions of the origin $O_2$ on the coordinate system $(X_1, Y_1, O_1)$ for first and second contact touches between the alignment patterns.

Without loss of generality, a case in which the second move is parallel to $Y_1$-axis as shown in FIG. 7 is used to describe how the angle $\theta_1$ can be derived. Two sets of measurements ($\gamma_1$, $\theta_1-\phi_1$, and ($\gamma_2$, $\theta_2-\phi_1$) are gathered along with the locations of M1 axis as well as the known displacement $\delta y$ from the two touches. Assuming that ($x_1$, $y_1$) and ($x_2$, $y_2$) are the two positions of $O_2$ in the ($X_1$, $Y_1$, $O_1$) coordinate for the first and second touches respectively, the relationship among these data can be expressed as follows:

$$\gamma_1^2=x_1^2+y_1^2 \text{ and } \gamma_2^2=x_1^2+(y_1-\delta y)^2.$$

From the above two equations, one can obtain $$y_1=(\delta y^2+\gamma_1^2-\gamma_2^2)/2\delta y \text{ and } x_1=\pm(\gamma_1^2-y_1^2)^{1/2}.$$

After solving $y_1$, there are two possible solutions for $x_1$. The correct $x_1$ can be determined based on the locations of $M_1$ or the quadrant in which the point ($x_1$, $y_1$) is located. The angle $\theta_1$ and $\phi_1$ can bd computed from the equations $\theta_1=\tan^{-1}((-x_1)/y_1)$ and $\kappa_1=\theta_1-\phi_1$, where $\kappa_1$ is measurement data.

Consequently, the alignment information $\gamma_1$, $\theta_1$, $\phi_1$ of the APM relative to the APW is obtained.

Figure 8:
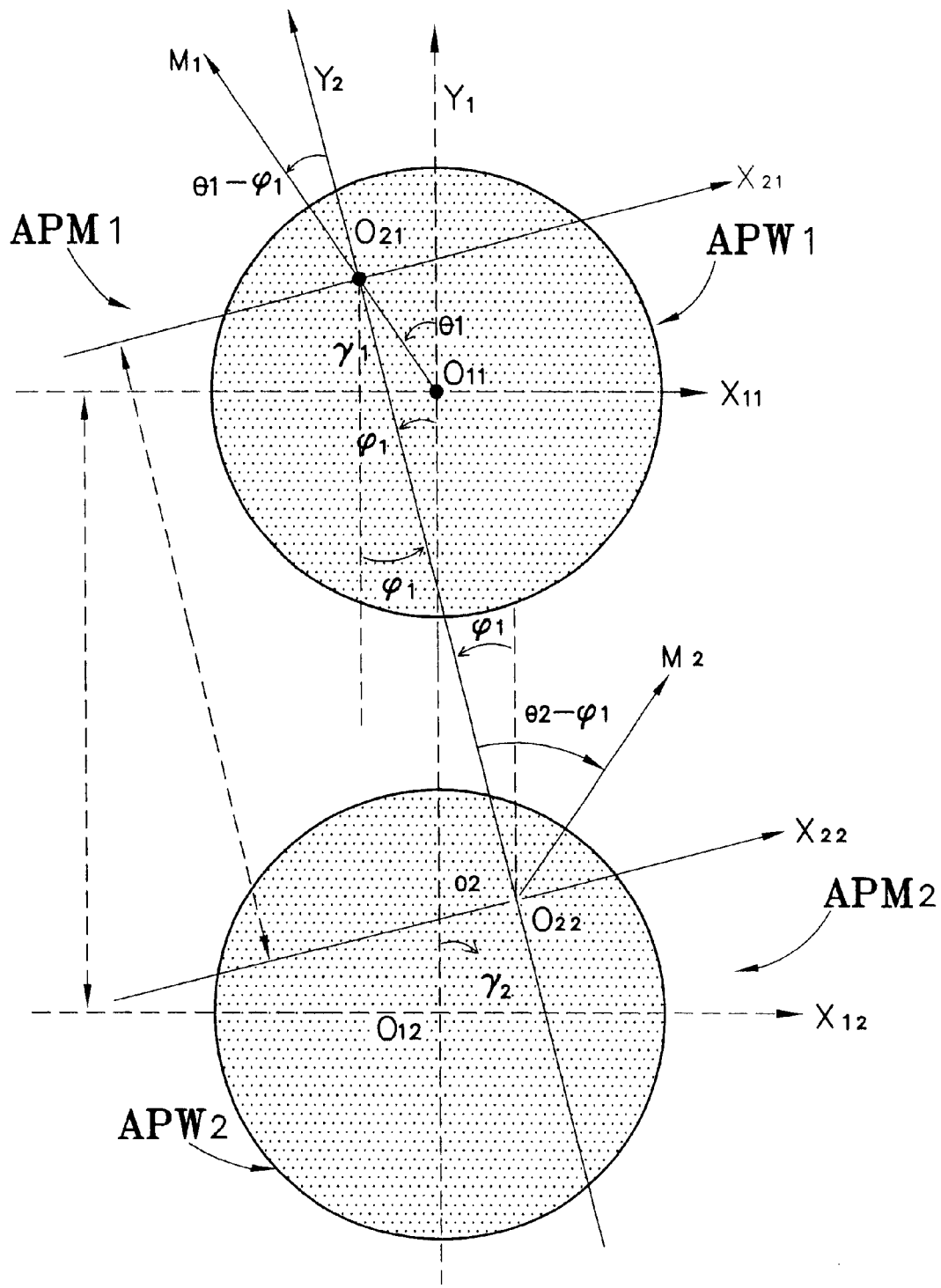
FIG. 8 shows how two alignment pattern pairs can be used for obtaining data in an alignment method of this invention.

The second approach for computing $\theta_1$ and $\phi_1$ requires two pairs of alignment patterns. Although a second touch is no longer needed, it is important that the two conditions described earlier are satisfied and the test-tip-0 of the APMs fall into their corresponding APWs simultaneously. FIG. 8 shows an example where two pairs of alignment patterns (APM$_1$, APW$_1$) and (APM$_2$, APW$_2$) are used to do the alignment. Two sets of measurement data can be acquired from the alignment patterns, i.e., ($\gamma_1$, $\theta_1-\phi_1$) and ($\gamma_2$, $\theta_2-\phi_1$), from one touch. Several equations can be used to express the relationship between these measurements and the centers $O_{11}$, $O_{12}$, $O_{21}$ and $O_{22}$ of the alignment patterns as follows:

$$|O_{11}O_{21} + O_{21}O_{22} - O_{11}O_{12}| = \gamma_2, \qquad (1)$$

$$|O_{12}O_{22} + O_{22}O_{21} - O_{12}O_{11}| = \gamma_1, \qquad (2)$$

$$O_{11}O_{21} = (-\gamma_1\sin\theta_1, \gamma_1\cos\theta_1),$$

$$O_{21}O_{22} = (L\sin\varphi_1, -L\cos\varphi_1), \text{ and}$$

$$O_{11}O_{21} = (0, -L),$$

where L is the distance between $O_{11}$ and $O_{12}$, and $O_{11}O_{21}$, $O_{21}O_{22}$, $O_{12}O_{22}$ and $O_{11}O_{12}$ are vectors expressed in the ($X_{11}$, $Y_1$, $O_{11}$) coordinate system. Assuming that $\kappa_1=\theta_1-\phi_1$, equation (1) can lead to the following equation:

$$(2\delta_1 L)\cos\theta_1+(-2L^2)\cos\phi_1=\gamma_2^2-\gamma_1^2-2L^2+2\gamma_1 L\cos\kappa_1.$$

Furthermore, with $\cos\theta_1=\cos(\kappa_1+\phi_1)=\cos\kappa_1\cos\phi_1-\sin\kappa_1\sin\phi_1$, the following equation can be written:

$$A\cos\phi_1+B\sin\phi_1=C, \qquad (3)$$

where $A = 2\gamma_1 L \cos \kappa_1 - 1L^2$, $B = -\gamma_1 L \sin \kappa_1$, and $C = \gamma_2^2 - \gamma_1^2 + A$.

Similarly, $O_{12}O_{22}$, $O_{22}O_{21}$, and $O_{12}O_{11}$ can be expressed as vectors in the $(X_{12}, Y_1, O_{12})$ coordinate system as follows:

$$O_{12}O_{22} = (-\gamma_2 \sin \theta_2, \gamma_2 \cos \theta_2), O_{22}O_{21} = (-L \sin \phi_1, L \cos \phi_1, \text{ and } O_{12}O_{11} = (0, L).$$

Assuming that $\kappa_2 = \theta_2 - \phi_1$, equation (2) can also lead to the following equation:

$$(2\gamma_2 L) \cos \theta_2 + (2L^2) \cos \phi_1 = \gamma_2^2 - \gamma_1^2 + 2L^2 + 2\gamma_2 L \cos \kappa_2.$$

Furthermore, with $\cos \theta_2 = \cos(\kappa_2 + \phi_1) = \cos \kappa_2 \cos \phi_1 - \sin \kappa_2 \sin \phi_1$, the following equation can be written:

$$A' \cos \phi_1 + B' \sin \phi_1 = C', \quad (4)$$

where $A' = 2\gamma_2 L \cos \kappa_2 + 2L^2$, $B' = -2\gamma_2 L \sin \kappa_2$, and $C' = \gamma_2^2 - \gamma_1^2 + A'$.

It is clear that from equations (3) and (4), both $(\gamma_1, \theta_1, \phi_1)$ and $(\gamma_2, \theta_2, \phi_1)$ can be solved.

The alignment described above can be made more accurate if the diameters of both the APW and the APM are enlarged. The number of the test tips per unit rotation angle increases as the diameter gets larger. Therefore, more rotation accuracy can be measured. Larger diameters for the alignment patterns also make the satisfaction of the two necessary conditions in the pre-alignment process easier because the test-tip-0 can fall into the APW more easily. However, the large size of diameters in the alignment patterns results in extra area cost for the WUT and the MP.

The alignment accuracy can also be increased by using more pairs of alignment patterns having position variations of test tips in either radial or rotational directions or both. The position variations can be small shifts in some tenths of the test-pin pitches. Nevertheless, more pairs of alignment patterns also require extra area cost.

It is also possible to use more sophisticated circuits to detect the variation on the contact conductance between the test tips and the metal surface of the APW, especially at the boundary of the APW. By having more accurate contact conductance measurement, the inside or outside property of a test tip relative to the APW can be more accurately determined. Each test tip can be estimated to be inside the APW with different levels instead of simply being inside or outside. Of course, the complexity of the measurement circuit on the MP may require the support of VLSI circuit design technology.

Figure 9:
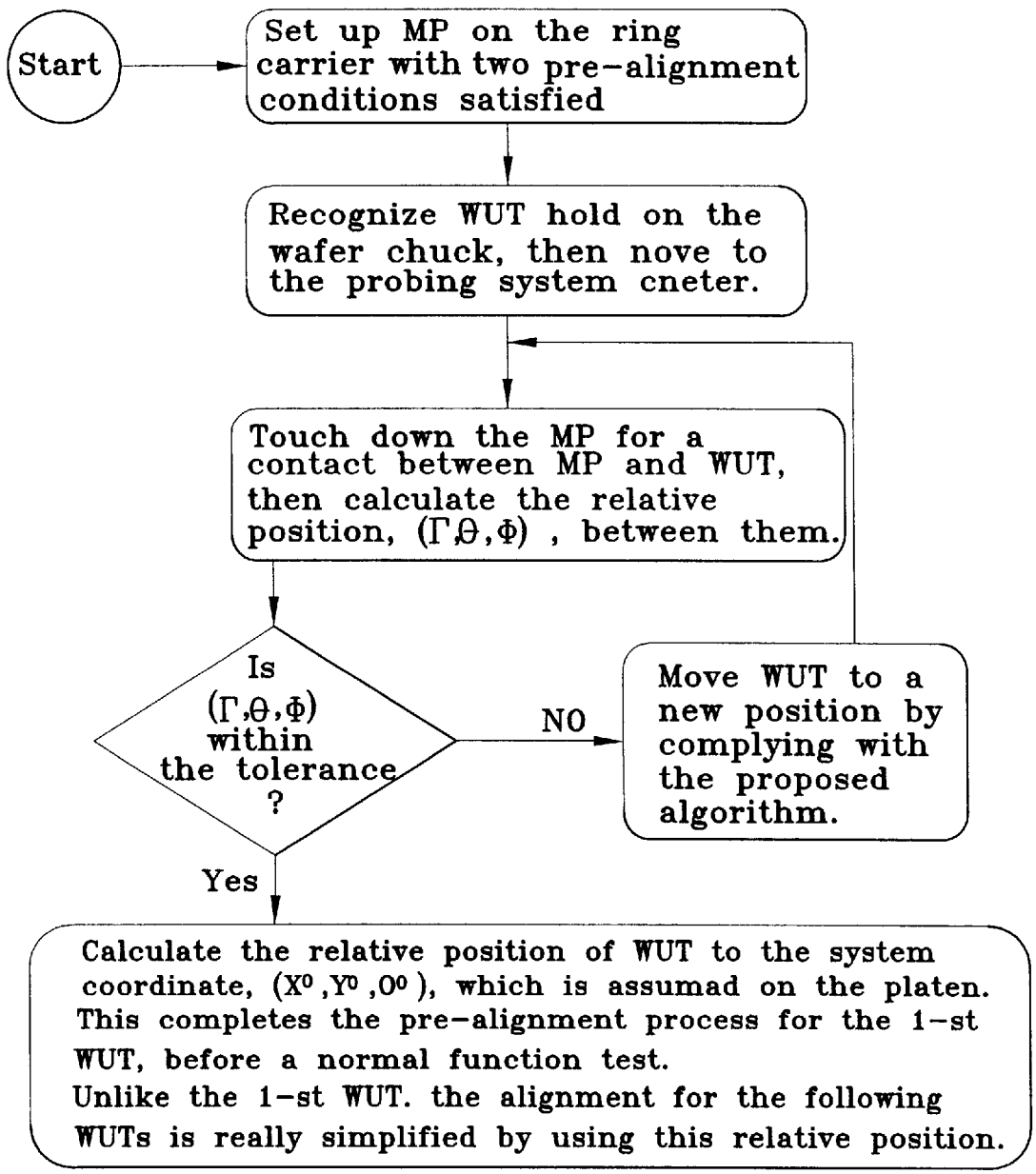
FIG. 9 shows a flow chart describing the automatic alignment algorithm of the present invention.

FIG. 9 shows a flow chart of applying the alignment algorithm of this invention in a membrane prober system. The membrane prober is first set up on the ring carrier with the two necessary conditions being satisfied. The wafer under test is recognized and a relative position to the platen is found. The wafer is manipulated to a predicted position under the membrane prober. The relative position $(\gamma, \theta, \phi)$ between the MP and WUT can be computed after a first contact between them. If the parameters $(\gamma, \theta, \phi)$ are within the tolerance, the alignment process is complete and the normal function test can be started. Otherwise, the wafer under test is moved to a new position and the parameters $(\gamma, \theta, \phi)$ are computed again after the MP and WUT make another contact according to the principle and algorithm described above.

Figure 10:
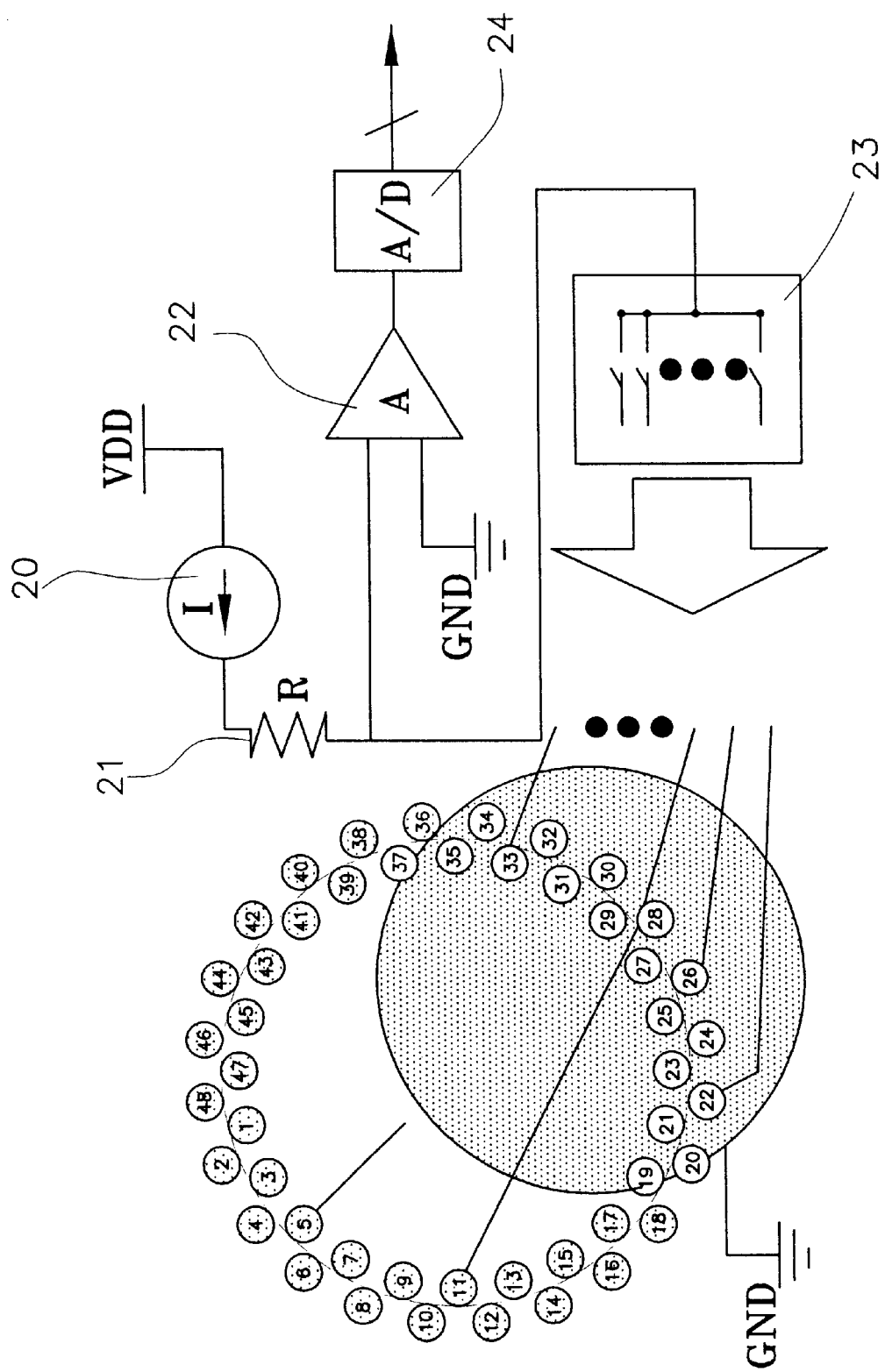
FIG. 10 shows an alternative circuit architecture of this invention for measuring the conductance of the current loop established between the wafer alignment pattern and one of the other test tips on the prober.
Figure 11:
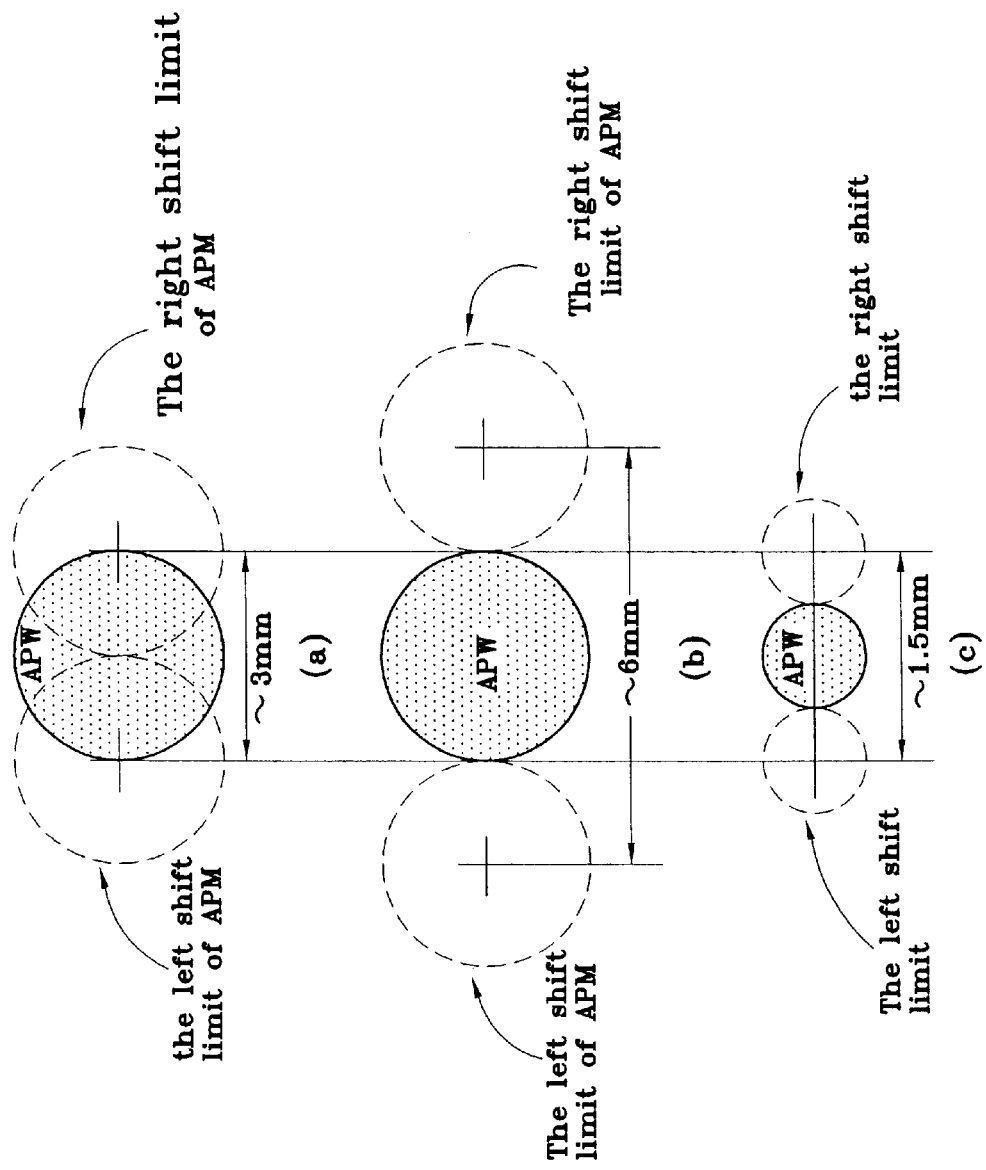
FIG. 11 shows (a) the positional offset tolerance between the alignment patterns if a test circuit of FIG. 6 is used; (b) the increased positional offset tolerance if a test circuit of FIG. 10 is used; and (c) the reduced sizes of the alignment patterns if a test circuit of FIG. 10 is used and the positional offset tolerance is not increased.

An alternative measurement circuit as shown in FIG. 10 can be used to simplify the first necessary condition. It can be seen that there is no test-tip-0 on the APM. The first necessary condition becomes satisfied as long as at least one of the test tips on the APM is kept within the APW after the pre-alignment. In other words, it is only necessary to maintain X-Y position shift tolerance of the APM within about twice the size of the solid metal pad of the APW. The benefit comes from the use of the latter test circuit can be seen from two aspects. One aspect is that the first pre-alignment condition can be more easily satisfied. As shown in FIGS. 11(a) and (b), the positional offset tolerance can be increased from 3 mm to 6 mmn if a test circuit of FIG. 10 instead of FIG. 6 is used. The other aspect is that the sizes of the APM and APW can be reduced with the positional offset tolerance being held the same. The benefit achieved by the size reduction of the APM and APW is particularly pronounced. According to the preferred size of the APM, it can be reduced down to about 1.5 mm as shown in FIG. 11(c). Therefore, the number of the test tips on the circumference of the virtual circle of the APM is reduced from 188 to 94. The I/O signal distribution (connected to each test tip) on the MP is greatly simplified.

With reference to FIG. 10, the circuit comprises a current source 20 that is connected through a resistor 21 to a first input terminal of an amplifier 22. A second input terminal of the amplifier 22 is grounded. A multiplexer 23 has a plurality of inputs each being connected to a test tip of the APM by a conducting trace on the MP, and a single output connected to the first input terminal of the amplifier 22. The output of the amplifier 23 is sent to an analog-to-digital (A/D) converter 24. In FIG. 10, a dynamic current path is formed between each of the multiplexed test tips falling inside of the APW and the APW itself which is electrically grounded. All the conductance information from these current paths are gathered and processed to determine the relative coordinate of the APM to the APW by an algorithm similar to how it is done with the circuit of FIG. 6. Because the ground points are different at the APW and the second input terminal of the amplifier 22, the extra conductance must be taken into account of in order to get more accurate conductance measurement.

It is suggested that the circuit used in this invention as shown in FIG. 6 or FIG. 10 should be active only during the alignment to avoid extra power consumption. During normal operation, the power to the circuit should be shut down. Similarly, if there are circuits that are not used for alignment, they should not be active during the alignment. In a membrane with the APM structures on it, the test tips for the alignment and the test tips for other normal test functions can be designed and manufactured in different and isolated membrane film areas. The tips are all on the same wafer or substrate so that they can be exerted different air pressure for reducing possible touch damages.

Other embodiments of this invention may also be modified by a person skilled in the field based on the disclosed principle. Although only the preferred embodiments of this invention were shown and described in the above description, it is requested that any modification or combination that comes within the spirit of this invention be protected.

What is claimed is:

1. A method for prober automatic alignment for aligning a prober having at least two prober alignment patterns and a wafer having at least two wafer alignment patterns, comprising the steps of:

defining a first coordinate system having a center $O_{11}$, and orthogonal $X_{11}$ and $Y_1$ axes on a first wafer alignment pattern having a first circular region centered at $O_{11}$;

defining a second coordinate system having a center $O_{12}$, and an $X_{12}$ axis orthogonal to said $Y_1$ axis on a second wafer alignment pattern having a second circular region centered at $O_{12}$;

defining a third coordinate system having a center $O_{21}$, and orthogonal $X_{21}$ and $Y_2$ axes on a first prober alignment pattern having a first virtual circle centered at $O_{22}$;

defining a fourth coordinate system having a center $O_{22}$, and an $X_{22}$ axis orthogonal to said $Y_2$ axis on a second prober alignment pattern having a second virtual circle centered at $O_{22}$;

performing a pre-alignment of said first and second prober alignment patterns to said first and second wafer alignment patterns for positioning said center $O_{21}$ within said first circular region and said center $O_{22}$ within said second circular region, said first virtual circle having a first arc portion being positioned outside said first circular region and the mid-point of said first arc portion and said center $O_{21}$ forming a first arc axis, and said second virtual circle having a second arc portion being positioned outside said second circular region and the mid-point of said second arc portion and said center $O_{22}$ forming a second arc axis;

acquiring a first set of measurement data for determining a first distance between said centers $O_{11}$ and $O_{21}$, and a first angle between said first arc axis and said $Y_2$ axis;

acquiring a second set of measurement data for determining a second distance between said centers $O_{12}$ and $O_{22}$, and a second angle between said second arc axis and said $Y_2$ axis;

and determining the angle between said $Y_1$ axis and said $Y_2$ axis by said first and second distances and said first and second angles.

2. The method for prober automatic alignment according to claim 1, wherein said first wafer alignment pattern includes a first solid conductive pad forming said first circular region; said second alignment pattern includes a second solid conductive pad forming said second circular region; said first prober alignment pattern includes a plurality of test tips, each having an equal distance to said center $O_{11}$, uniformly distributed on an inner virtual circle centered at $O_{11}$, and a plurality of test tips, each having an equal distance to said center $O_{11}$, uniformly distributed on an outer virtual circle centered at $O_{11}$; and said second prober alignment pattern includes a plurality of test tips, each having an equal distance to said center $O_{22}$, uniformly distributed on an inner virtual circle centered at $O_{22}$, and a plurality of test tips, each having an equal distance to said center $O_{22}$, uniformly distributed on an outer virtual circle centered at $O_{22}$.

3. The method for prober automatic alignment according to claim 2, wherein said first set of measurement data are measured by a circuit comprising:

a current source;

an amplifier having a first input terminal connected through a resistor to said current source, a second input terminal connected to ground, and an output connected to an analog to digital converter;

and a multiplexer having an output connected to said first input terminal of said amplifier and a plurality of inputs each being connected to one of said test tips on said first prober alignment pattern;

wherein said first solid conductive pad is connected to ground and said analog to digital converter provides said first set of measurement data.

4. The method for prober automatic alignment according to claim 2, wherein said second set of measurement data are measured by a circuit comprising:

a current source;

an amplifier having a first input terminal connected through a resistor to said current source, a second input terminal connected to ground, and an output connected to an analog to digital converter;

and a multiplexer having an output connected to said first input terminal of said amplifier and a plurality of inputs each being connected to one of said test tips on said second prober alignment pattern;

wherein said second solid conductive pad is connected to ground and said analog to digital converter provides said second set of measurement data.

5. The method for prober automatic alignment according to claim 2, wherein said first prober alignment pattern further includes a central test tip located on said center $O_{11}$ and said second prober alignment pattern further includes a central test tip located on said center $O_{22}$.

6. The method for prober automatic alignment according to claim 5, wherein said first set of measurement data are measured by a circuit comprising:

a current source;

an amplifier having a first input terminal connected to said current source and the central test tip on said first prober alignment pattern, a second input terminal connected through a resistor to ground, and an output connected to an analog to digital converter;

and a multiplexer having an output connected to said second input terminal of said amplifier, and a plurality of inputs each connected to one of said test tips on said first prober alignment pattern;

wherein said analog to digital converter provides said measurement data.

7. The method for prober automatic alignment according to claim 5, wherein said second set of measurement data are measured by a circuit comprising:

a current source;

an amplifier having a first input terminal connected to said current source and the central test tip on said second prober alignment pattern, a second input terminal connected through a resistor to ground, and an output connected to an analog to digital converter;

and a multiplexer having an output connected to said second input terminal of said amplifier, and a plurality of inputs each being connected to one of said test tips on said second prober alignment pattern;

wherein said analog to digital converter provides said measurement data.

* * * * *